(12) United States Patent
Kwok et al.

(10) Patent No.: US 6,583,623 B1
(45) Date of Patent: *Jun. 24, 2003

(54) INTERLEAVED WATER AND FAT DUAL-ECHO SPIN ECHO MAGNETIC RESONANCE IMAGING WITH INTRINSIC CHEMICAL SHIFT ELIMINATION

(75) Inventors: Wingchi Edmund Kwok, Rochester, NY (US); Jianhui Zhong, Pittsford, NY (US); Saara Marjatta Sofia Totterman, Rochester, NY (US)

(73) Assignee: University of Rochester, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/821,087

(22) Filed: Mar. 30, 2001

Related U.S. Application Data

(60) Provisional application No. 60/193,459, filed on Mar. 31, 2000.

(51) Int. Cl.[7] .................................................. G01V 3/00
(52) U.S. Cl. ....................... 324/307; 324/306; 324/309; 324/312
(58) Field of Search ................................. 324/306, 312, 324/307, 308, 309, 314, 318; 600/419, 413

(56) References Cited

U.S. PATENT DOCUMENTS

| | | | |
|---|---|---|---|
| 4,794,337 A | | 12/1988 | Twieg .......................... 324/309 |
| 4,972,148 A | * | 11/1990 | Jensen ......................... 324/309 |
| 4,983,920 A | | 1/1991 | Lampman et al. ........... 324/309 |
| 5,079,505 A | * | 1/1992 | Deimling et al. ............ 324/311 |
| 5,270,652 A | * | 12/1993 | Dixon et al. ................. 324/309 |
| 5,361,028 A | * | 11/1994 | Kanayama et al. .......... 324/309 |
| 5,557,202 A | * | 9/1996 | Miyazaki et al. ............ 324/307 |
| 5,657,758 A | * | 8/1997 | Posse et al. .................. 600/413 |
| 5,677,626 A | * | 10/1997 | Miyazaki et al. ............ 324/307 |
| 5,729,138 A | * | 3/1998 | Purdy et al. ................. 324/309 |
| 5,891,032 A | * | 4/1999 | Harvey ........................ 600/419 |
| 6,046,589 A | | 4/2000 | Lamerichs et al. ......... 324/309 |
| 6,320,377 B1 | * | 11/2001 | Miyazaki et al. ........... 324/306 |
| 6,373,249 B1 | * | 4/2002 | Kwok et al. ................. 324/306 |

OTHER PUBLICATIONS

Kwok et al., "Interleaved Water and Fat Dual–Echo Spin Echo Imaging With Intrinsic Chemical–Shift Elimination", Journal of Magnetic Resonance Imaging vol. 13 pp. 318–323 2001.*
Kwok et al., article "Simultaneous Water and Fat MRI With Intrinsic Chemical–Shift Correction", Proceedings of the 22nd Annual EMBS International Conference, Jul. 23–28th, 2000, Chicago Illinois pp. 3114–3117.*
Kwok et al., article "3D Interleaved Water and Fat Image Acquisition With Chemical–Shift Correction", Magnetic Resonance in Medicine vol. 44 pp. 322–330 Jul. 25th 2000.*
Dixon article "Simple proton spectroscopic imaging" Radiology vol. 153, 1984 pp. 189–194.*
"Simultaneous Highly Selective MR Water and Fat Imaging Using a Simple New Type of Spectral–Spatial Excitation," Fritz Schick MRM 40:194–202 (1996).

* cited by examiner

*Primary Examiner*—Edward Lefkowitz
*Assistant Examiner*—Tiffany A. Fetzner
(74) *Attorney, Agent, or Firm*—Blank Rome, LLP

(57) ABSTRACT

In magnetic resonance imaging, a pulse sequence is used to obtain both water-only and fat-only signals within a single acquisition time. Pulses and readout gradients are applied to take a proton-density-weighted image of the water, a proton-density-weighted image of the fat, and a T2-weighted image of the water. Between the first water readout gradient and the fat readout gradient, a spoiling gradient is applied to spoil the first water echo. Between the fat readout gradient and the second water readout gradient, a refocusing gradient is applied to refocus the second water echo. The proton-density-weighted images of water and fat are combined to form water-plus-fat images free of in-plane and through-plane chemical-shift artifacts.

21 Claims, 6 Drawing Sheets

INTERLEAVED WATER AND FAT DUAL-ECHO SPIN ECHO MAGNETIC RESONANCE IMAGING WITH INTRINSIC CHEMICAL SHIFT ELIMINATION

REFERENCE TO RELATED APPLICATION

The present application claims the benefit of U.S. Provisional Application No. 60/193,459, filed Mar. 31, 2000, whose disclosure is hereby incorporated by reference in its entirety into the present disclosure.

FIELD OF THE INVENTION

The present invention is directed to magnetic resonance imaging (MR imaging, or MRI) and more particularly to MR imaging in which water-only and fat-only images are taken without the interference of each other, and combined water-plus-fat images are formed.

DESCRIPTION OF RELATED ART

MR images are the presentation of the specific chemical environment of the imaged protons. The information from the chemical environment of the protons can be acquired in many different ways. A pulse sequence is applied to excite the protons and to acquire the information. The pulse sequence is designed to acquire specific information from specific chemical species. The most useful species in living tissues are water and fat. Therefore, several pulse sequences have been developed to acquire and display information only from water containing tissues or only from fat containing tissues. The routine sequence displays data from both water and fat containing tissues. The water-only images have widespread use in the clinical environment due to their ability to eliminate the high signal intensity fat and highlight the pathology in the organs and structures. The disadvantages in the previously developed sequences have been related to inadequate elimination of the chemical species not imaged (fat in particular), to a chemical shift artifact which is related to the different precession frequency between water and fat resulting in local misplacement of the anatomic structures, and to long acquisition time. In addition, if both fat suppressed (water-only) images and non-fat-suppressed (water-plus-fat) images are needed, two different data acquisitions are required with an increased imaging time. The long acquisition time to acquire water-plus-fat and water-only images is specifically a disadvantage in 2D dual-echo spin—echo (SE) imaging where acquisition times are inherently long.

Fat suppression sequences have often been used clinically to improve musculoskeletal system evaluation. Among those sequences, T2-weighted (T2W) water-only (fat-suppressed) spin echo images are most commonly used in clinical practice. Such images are described in T. T. Miller et al, "Fat-suppressed MRI of musculoskeletal infection: fast T2-weighted techniques versus gadolinium-enhanced T1-weighted techniques," (Skeletal Radiol. 1997; 26:654–658). Although water-only images demonstrate the pathology, water-plus-fat (non-fat suppressed) proton density weighted (PDW) images are still needed for anatomic details. So far, water-only and water-plus-fat images are normally acquired using two separate imaging sequences. The increasing pressure in clinical practice to increase throughput, however, limits the number of sequences that can be prescribed in a clinical study, prompting the development of pulse sequences that will improve the ratio of information provided to the imaging time used.

Different techniques have been proposed to obtain water-only and fat-only images. In chemical saturation techniques an additional long spectrally selective RF pre-saturation pulse is applied before the RF excitation pulse to suppress the signal of the unwanted chemical species. The chemical saturation technique is explained by Harms S E, Flaming D P, Hesley K L, et al. "MR imaging of the breast with rotating delivery of excitation off resonance; clinical experience with pathologic correlation" (*Radiology* 1993; 187:493–501); Haase A, Frahm J. "Multiple chemical shift selective NMR imaging using stimulated echoes" (*J Magn Reson* 1985; 64:94–102); Pauly J M, Nishimura G G, Macovski A, "Multidimensional selective excitation" (*Proc Soc Magn Reson Med* 1988;7:654); Joseph, P M, "A spin echo chemical shift MR imaging technique" (*J Comput Assist Tomogr* 1985; 9:651–658); and Dumoulin C L, "A method for chemical-shift-selective imaging" (*Magn Reson Med* 1985; 2:583–585). This technique, however, is sensitive to $B_0$ and $B_1$ inhomogeneities, and it also either increases the TR time or reduces the number of imaging slices.

Another method is the Dixon method, which is described in G. Glover et al, "Three-point Dixon technique for true fat/water decomposition with $B_0$ inhomogeneity correction," (*Magn. Reson. Med.* 1995; 34:120–124). Although it provides water-only and fat-only images simultaneously and is less susceptible to the Bo inhomogeneity, it increases imaging time in gradient echo sequences. A modified Dixon method has been developed to reduce imaging time, as described by Lethimonnier F, Franconi F, Akoka S. "Three-point Dixon method with a MISSTEC sequence." (*Magnetic Resonance Materials In Physics, Biology & Medicine* 1997; 5(4): 285–288), but there is an accompanying loss in signal-to-noise ratio (SNR).

Recently, an echoplanar spectroscopic imaging technique that produces water, fat and water-plus-fat images without in-plane chemical-shift artifacts is described by Sarkar S, Heberlein K, Metzger G J, Zhang X D, Hu X P, "Applications of high-resolution echoplanar spectroscopic imaging for structural imaging." (*J Magn Reson Imaging* 1999;10:1–7). However, this technique suffers from poor SNR and cannot be used for high resolution imaging in clinical settings.

Another approach for simultaneous water and fat imaging uses spatial-spectral excitation with alternating water and fat acquisition schemes, and has been implemented on 2-D gradient echo (GRE) sequences, as described by Meyer C H, Pauly J M, Macovski A, Nishimura D G. "Simultaneous Spatial and Spectral Selective Excitation." (*Magn Reson Med* 1990; 15:287–304). Spatial-spectral excitation has also been applied to 2-D SE imaging, as described by Schick F. "Simultaneous highly selective MR water and fat imaging using a simple new type of spectral-spatial excitation." (*Magn Reson Med* 1998; 40:194–202) and has been found to provide better fat suppression than the conventional pre-saturation technique. Schick teaches 2D gradient echo imaging in which (water+fat) and (water−fat) signals are acquired. That technique requires at least two acquisitions and thus provides no saving in time compared to conventional fat and non-fat suppressed imaging. In-plane chemical shift correction by processing is not performed, and through-plane chemical shift misregistration cannot be corrected. Meyer et al teaches 2D gradient echo imaging in which water and fat signals are acquired alternately every TR/2 period. In-plane chemical shift is not mentioned. The maximum number of imaging slices is reduced relative to the regular 2D GRE sequence.

Recently, the present inventors developed a 3-D GRE pulse sequence that produced water images and fat images in a single acquisition time using spatial-spectral excitation.

That study also provided a correction for the chemical shift artifacts that may hinder the evaluation of diseases such as osteonecrosis.

SUMMARY OF THE INVENTION

It is an object of the present invention to address all of the above issues.

It is another object of the invention to have water-only and fat-only SE images without interference of each other It is still another object of the invention to acquire water-only and fat-only images during the same acquisition time, to acquire water-only and fat-only images, and to produce water-plus-fat images without chemical-shift artifact.

It is yet another object of the invention to develop a dual-echo spin echo (SE) sequence that simultaneously provides PDW water-only, PDW fat-only, PDW water-plus-fat images without chemical-shift artifact, and T2W water-only images in a single imaging time.

To achieve the above and other objects, the present invention is directed to a technique in a 2-D variable-echo dual-echo SE sequence which will be referred to as interleaved water and fat dual-echo spin echo imaging without chemical shift (IWFSEC). The technique can be implemented on commonly available equipment such as a 1.5 Tesla clinical scanner. By making efficient use of the timing between the first and second echoes, IWFSEC enables the simultaneous acquisition of PDW water-only, PDW fat-only and T2W water-only images in a single imaging time, while maintaining the same maximum number of imaging slices compared to that of the regular dual-echo SE sequence. Since the water and fat signals are excited and acquired at their individual resonant frequencies separately, the chemical shift between water and fat is removed automatically. This enables us to combine the PDW water-only and fat-only images to form water-plus-fat images that are free of in-plane and through-plane misregistration due to chemical shift.

The pulse sequence of the present invention provides 2D SE water-only and fat-only images without interference from each other. It acquires water-only and fat-only images during the same data acquisition time and produces water-plus-fat images with perfect local registration, eliminating the chemical shift artifact, which none of the sequences of the prior art has been able to provide so far.

One aspect of the present invention is in the optimized use of the time between the first and second water echoes to excite and acquire the fat signal. This is not a trivial achievement, since regularly the water and fat signals interfere with each other, so that the images of both species are affected. However, by using tailored spatial-spectral excitations as well as dephasing and rephasing field gradients, the present invention effectively uncouples the water and fat signals. The present invention allows both sets of water and fat images to be obtained in a single acquisition time and saves half of the scan time over conventional fat suppressed and non-fat suppressed imaging. The present invention further provides a technique for intrinsically eliminating the in-plane and through-plane chemical shift misregistration between the water and fat images. The water and fat images can then be combined to form water-plus-fat images free of chemical shift artifacts in both in-plane and through-plane directions.

The present invention thereby provides the following advantages over Schick and over Meyer et al. The present invention provides a 2D dual-echo spin-echo imaging technique for acquiring water-only and fat-only signals within a single acquisition time, thereby saving half of the scan time. Both in-plane and through-plane misregistration caused by chemical shift are intrinsically eliminated. Fat signals are acquired between the first and second water signals during every TR period. The same maximum number of imaging slices as in the regular 2D SE sequence is maintained.

The present technique is taught in Kwok et al, "Interleaved Water and Fat Dual-Echo Spin Echo Imaging with Intrinsic Chemical-Shift Elimination," *Journal of Magnetic Resonance Imaging*, 13:318–323 (2001), in which it is called interleaved water and fat dual-echo spin echo imaging without chemical shift (IWFSEC). The disclosure of that article is hereby incorporated by reference into the present disclosure.

BRIEF DESCRIPTION OF THE DRAWINGS

A preferred embodiment of the present invention will be set forth in detail with reference to the drawings, in which.

DETAILED DESCRIPTION OF THE PREFERRED EMBODIMENT

A preferred embodiment of the present invention will now be set forth in detail with reference to the drawings.

Figure 1:
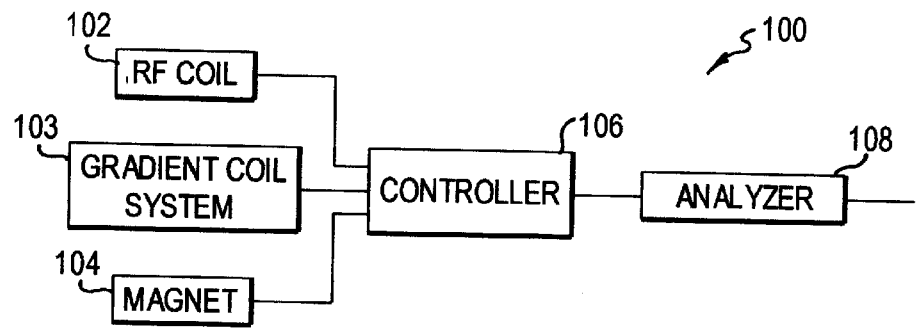
FIG. 1 is a block diagram showing an overview of a system on which the preferred embodiment can be implemented.

The study was performed on a GE (General Electric Medical Systems, Milwaukee, Wis.) SIGNA (Horizon 5.8, Echo Speed) 1.5 Tesla system with a maximum gradient strength of 23 mT/m and maximum gradient switched rate of 120 mT/m/ms. A block diagram of such a system 100 is shown in FIG. 1. An RF coil 102, a gradient coil system 103 and a magnet 104 supply the fields used in imaging under the control of a controller 106. An analyzer 108 such as an SGI workstation analyzes the data to form an image. The analyzer 108 can be any sufficiently powerful computer. It is worth noting that the embodiment of the present invention can be realized on any MR scanners of modern design at various field strengths and field gradient configurations.

Figure 2:
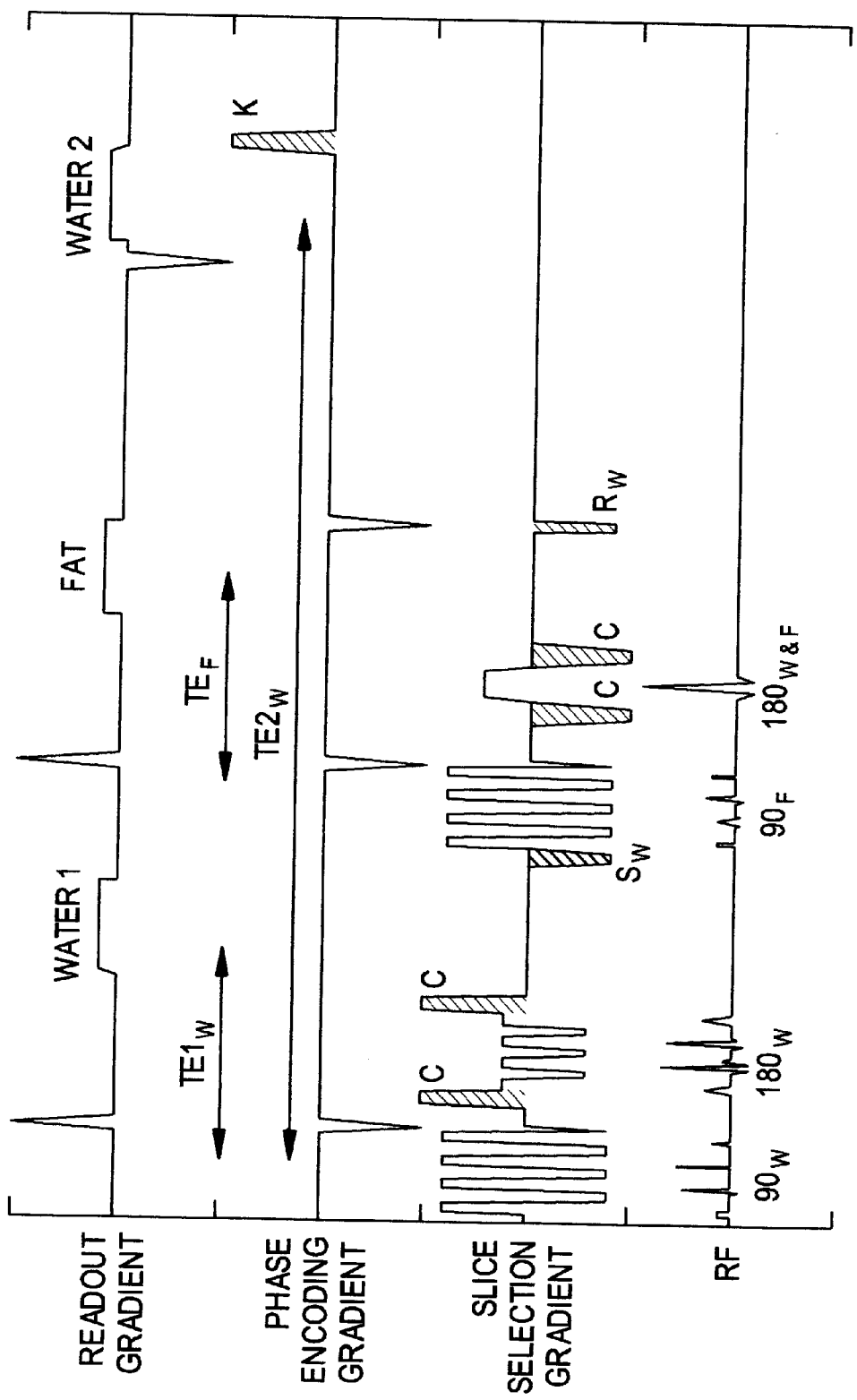
FIG. 2 is a diagram showing the pulse sequence used in the preferred embodiment.

A regular multi-echo 2D spin echo sequence was modified as shown in FIG. 2. Water 1, Fat, Water 2 and $TE1_W$, $TE_F$, $TE2_W$ are the readout windows and TEs for the first water echo, fat echo and second water echo respectively. $90_W$ and $180_W$ are the spatial-spectral excitations at water frequency, $90_F$ is the spatial-spectral excitation at fat frequency, and $180_{W\&F}$ is the non-spectrally but spatially selective 180° refocusing pulse. $S_W$ and $R_W$ are the gradient to spoil the first water echo and the gradient to refocus the second water echo, respectively. The crushers for the two 180° pulses are denoted by C, while the spoiler gradient at the end of the sequence is labeled K.

A binomial 1-3-3-1 spatial-spectral excitation using Shinnar-Le Roux (SLR) sub-pulses was used for the separate 90° excitations of water and fat and also for the 180° refocusing pulse of the first water echo signal. The 1-3-3-1 binomial combination was selected over other possible combinations due to its overall performance in spectral profile and pulse duration. SLR waveform was chosen since it provides rectangular spatial excitation profile with sharp edge transition, but other waveforms such as sync function may also be used instead. For the 90° pulses, a linear phase spin echo SLR subpulse was generated with an 800 µs pulse duration, 4.5 kHz bandwidth, 1.0% pass-band ripple and 0.5% stop-band ripple. The 180° refocusing pulse for the first water echo was generated using a linear phase inversion SLR pulse with similar parameters but 1.2 ms pulse duration and 3 kHz bandwidth. A longer width was needed for this 180° pulse to reduce the RF amplitude to within the limit of the scanner. The gradient was modified to consist of asymmetric positive and negative lobes, with the positive lobe having a lower amplitude but larger width. The separation between successive SLR sub-pulses was 2.3 ms, creating frequency selective and null regions separated by 217 Hz. This corresponds to the difference in water and fat resonance frequencies of 3.35 ppm at 1.5 T. The width of the 1-3-3-1 binomial pulse for either the 90° or the 180° pulse is 8.0 ms.

During the scan, the water-only signal is first excited and acquired. The fat-only signal is later excited with the carrier frequency shifted to the fat resonance frequency. A single non-spectral selective 180° pulse is then used to refocus the spins of both chemical species, generating the first echo for fat and the second echo for water. Spatial-spectral excitation is used in the first 180° pulse for water instead of the regular non-spectral selective pulse to avoid disturbing the fat signal, which otherwise will undergo partial inversion recovery before being excited. Since body fat has a short T1 of about 250 ms, a typical 20 ms time delay between the first 180° pulse and the fat excitation reduces the fat signal by about 15% if a non-spectral selective first 180° pulse is used. In addition, a spoiler gradient is applied before the fat excitation to eliminate the water signal during fat signal acquisition. A reversed gradient of equal magnitude is then applied after the fat acquisition to refocus the second water echo signal. The receive frequency of each individual echo is set at the frequency of the chemical species being examined. In this way, the in-plane chemical shift between water and fat images is eliminated. Since each species is excited separately at its own frequency, there is no offset in the slab selection, and thus there is no through-plane chemical shift between water and fat either. Arbitrary echo times suitable for the clinical use can be selected for each of the three echoes individually. The second echo of fat is not acquired in the current implementation since the T2W water-only image is usually sufficient for diagnosis. After imaging, the PDW water-only and PDW fat-only data are combined to form the PDW water-plus-fat image. The water-plus-fat image can be formed either by adding together the water and fat magnitude images, or by adding the real and imaginary raw data of water with those of the fat and then performing a Fourier-transformn.

Figure 5:
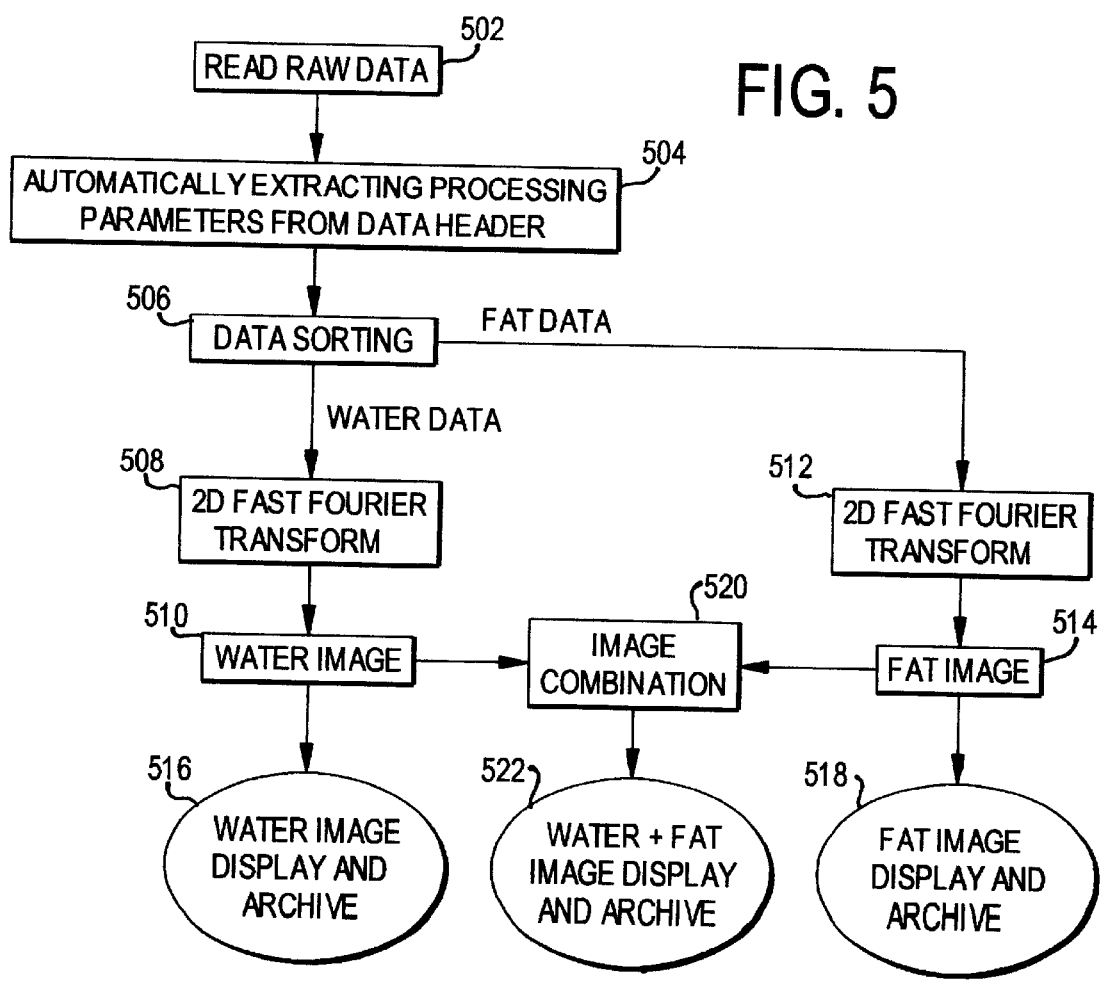
FIGS. 4 and 5 are flow charts showing data acquisition and processing.
Figure 4:
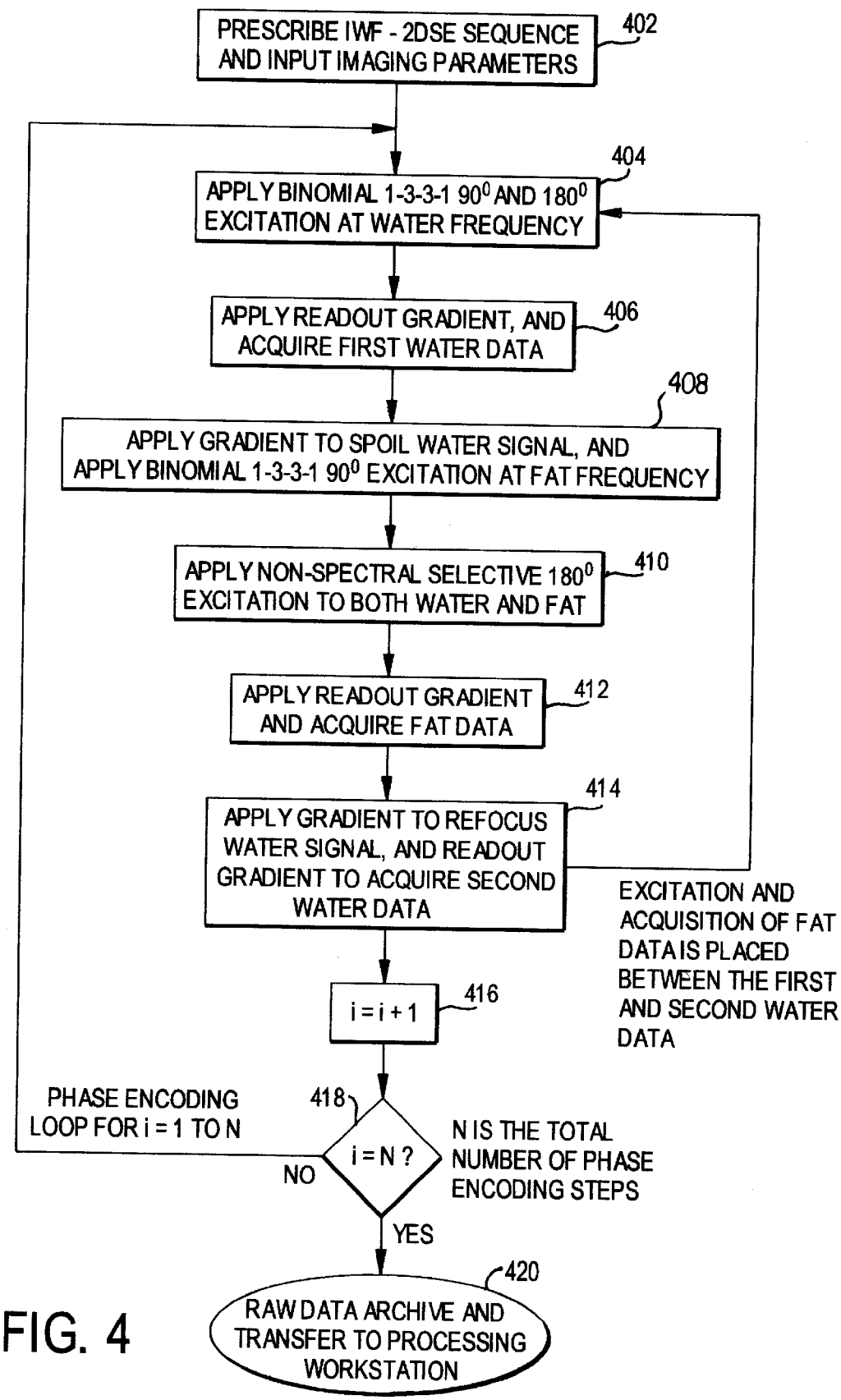

The scanning process will be explained with reference to the flow charts of FIGS. 4 and 5. FIG. 4 shows the taking of the raw data, while FIG. 5 shows the processing of the thus taken raw data.

The process of FIG. 4 supposes a total number N of phase encoding steps. In step 402, the pulse sequence is prescribed, and the imaging parameters are input. The imaging parameters include repetition time (TR), echo time (TE), RF flip angle, field of view (FOV), slice thickness, matrix size in the frequency encoding direction, matrix size in the phase encoding direction (total number of phase encoding steps), imaged slice orientation, slice position, receiver bandwidth and averaging number. They are prescribed by manual entry on the MR scanner console, before scanning. In step 404, the binomial 1-3-3-1 90° and 180° excitations are applied at the water frequency. In step 406, a readout gradient is applied, and the first water data are acquired. In step 408, a gradient is applied to spoil the water signal, and a binomial 1-3-3-1 90° excitation is applied at the fat frequency. In step 410, a non-spectral selective 180° excitation is applied to both the water and the fat. In step 412, a readout gradient is applied to acquire the fat data. In step 414, a gradient is applied to refocus the water signal, and a readout gradient is applied to acquire the second water data. The number i of the phase encoding step is incremented in step 416, and if it is determined in step 418 that the total number of phase encoding steps has been carried out, then in step 420, the raw data are archived and transferred to a processing workstation. If the total number of phase encoding steps has not been carried out, then the process is restarted, beginning with step 404, for the next phase encoding step.

In the processing workstation, the raw data archived in step 420 are read in step 502. The processing parameters are extracted automatically from the header information in the data file in step 504. Those include image matrix dimensions, number of imaging slices, and number of RF coil elements. In step 506, the data are sorted between water data and fat data. The water data are subjected to a 2D fast Fourier transform in step 508 to form a water image in step 510; similarly, the fat data are subjected to a 2D fast Fourier transform in step 512 to form a fat image in step 514. The water and fat images are displayed and archived in steps 516 and 518, respectively. Also, the water and fat images are combined in step 520, and the resulting water-plus-fat image is displayed and archived in step 522.

The IWFSEC sequence was evaluated quantitatively by imaging a phantom consisting of two separate bottles of water and acetone (with Larmor frequency similar to that of fat). The body coil was used with TR/TE/TE2=1000 ms/25 ms/100 ms, FOV of 32 cm, and slice thickness of 7 mm. Under the same parameter settings, three additional sets of images were acquired, each with either the water 90° RF pulse, the water 180° RF pulse, or the fat 90° RF pulse set to zero. This was done to evaluate the cross-talk between the water and fat RF pulses. The phantom was also imaged with the regular variable-echo dual-echo SE sequence using same imaging parameters. The results of the above measurements were then compared quantitatively.

To compare the performance of IWFSEC with that of the regular SE sequence in-vivo, the knees of three normal volunteers were imaged with both sequences using a home-built 4-coil phased array with TR/TE/TE2=200 ms/22 ms/90 ms, FOV of 18 cm, slice thickness of 6 mm, 256×128 matrix and 4:40 min acquisition time. The images were then compared regarding the contrast behavior and degree of fat suppression.

Figure 3A:
FIGS. 3A–3G show experimental results.
Figure 3B:
Figure 3C:
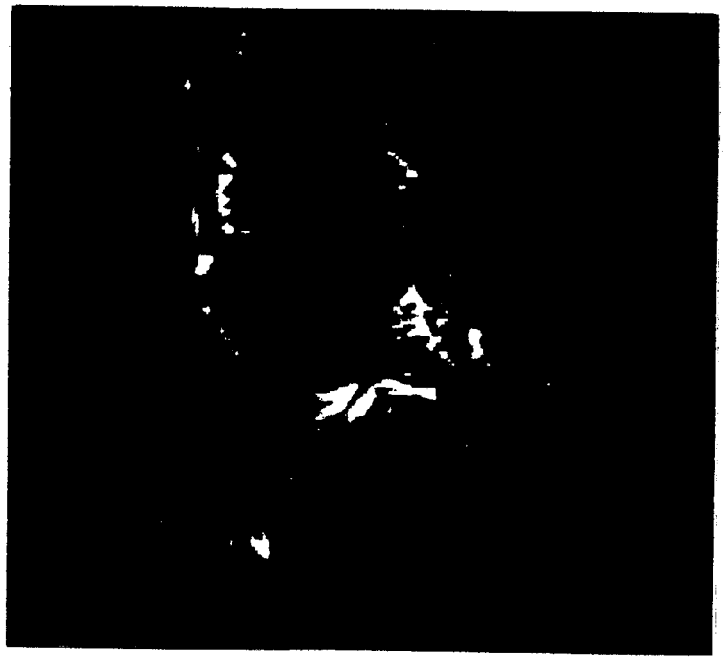
Figure 3D:
Figure 3E:
Figure 3F:
Figure 3G:

The resulting images from the knee of a normal volunteer are shown in FIGS. 3A–3D (according to the preferred embodiment) and in FIGS. 3E–3G (regular SE images). The PDW (first echo) and T2W (second echo) water images in FIGS. 3B and 3C show better suppression of the fat signal in the bone marrow and other regions than the corresponding fat-suppressed water images in FIGS. 3F and 3G, giving better delineation of the cartilage and fluid. The fat image in FIG. 3D shows good suppression of the muscle signal. The water-plus-fat image with intrinsic chemical shift elimination in FIG. 3A is free from artifacts at the water and fat boundaries seen in the regular SE image in FIG. 3E (see arrow) and provides a sharper and more accurate depiction of bone.

Table 1 below shows SNR measurements of the first (W1) and second (W2) echo water images and the first (F1) and second (F2) echo fat images in the water and acetone phantom study. The mean and standard deviation of the background noise are 9.7 and 5.0 respectively for all images. In the phantom study, the signal-to-noise ratios (SNR) of both water and fat were similar in all tested sequences, as shown in Table 1. When the amplitude of the 90° or 180° RF pulse of a chemical species was set to zero, the signal of that species became zero but the signal intensity of the other species was not affected. This indicates that there is minimal cross-talk between the water and fat RF pulses in the new sequence, and that the image contrast remains the same as that of the regular SE sequence. In the in-vivo study, the IWFSEC sequence shows better fat suppression in the water-only image than the regular fat-suppressed (FATSAT) SE sequence, and without chemical shift, the shadow artifacts between water and fat boundaries in the water-plus-fat image are removed entirely.

TABLE 1

|  | Water | Acetone | Acetone F1 / Water W1 | Water W2 / Water W1 |
|---|---|---|---|---|
| IWFSEC |  |  |  |  |
| W1 | 348 | 10.9 |  |  |
| F1 | 14.7 | 167 |  |  |
| W2 | 314 | 11.1 |  |  |
| Intensity ratio |  |  | 0.48 | 0.90 |
| 2-D SE |  |  |  |  |
| Regular W1,F1 | 360 | 188 |  |  |
| Regular W2,F2 | 326 | 175 |  |  |
| FATSAT W1,F1 | 363 | 13.3 |  |  |
| FATSAT W2,F2 | 331 | 11.8 |  |  |
| Intensity ratio |  |  | 0.52 | 0.91 |

The preferred embodiment provides a variable-echo dual-echo SE imaging technique, IWFSEC, for simultaneous water and fat imaging. This SE sequence produces PDW water-only, PDW fat-only images, PDW water-plus-fat images, as well as T2W water-only images in a single imaging time, and saves half of the imaging time over separate acquisitions of fat suppressed and non-fat suppressed images in normal clinical settings. Since the fat signal is excited and acquired between the first and second water echoes, IWFSEC maintains the same maximum number of imaging slices as the non-fat suppressed SE sequence within a given TR period. Depending on the TR and TE values, IWFSEC allows more imaging slices than the regular fat suppressed SE sequence in which a long pre-saturation RF pulse is needed for each imaging slice.

Another major advantage of this technique is that there is neither in-plane nor through-plane chemical shift between the water and fat images. Since water and fat are separately excited and their signals are separately received at their individual resonant frequencies, there is no frequency offset with respect to the carrier frequencies for either the water or the fat. As a result, in water-plus-fat images the chemical shift between water and fat is removed in both in-plane and slice directions. Although the Dixon method also provides separate water and fat images, water and fat signals are obtained together, and chemical shift cannot be removed during acquisition. The in-plane chemical shift artifacts can only be corrected afterwards by changing the phase in the raw data, or by shifting the water or fat images in the readout direction. Furthermore, the slice misregistration cannot be corrected in the Dixon method.

For a ±16 kHz receive bandwidth, the in-plane chemical shift in the regular SE sequence is about two pixels. The inventors' data, which shows that in water-plus-fat images chemical shift artifacts result in misleading thickening of water/fat structural boundaries, suggests that their removal may have an impact on clinical disease evaluation. With the elimination of in-plane chemical shift artifacts, a lower receive bandwidth can be used to reduce noise and increase SNR. In comparison with the regular fat-suppressed SE sequence in the normal volunteer study, it was found that the IWFSEC sequence provides better fat suppression in the T2W water image, giving better visualization of cartilage and fluid in musculoskeletal joints.

One trade-off of the IWFSEC sequence is the increase in minimum slice thickness due to the short duration of the RF sub-pulse used in the spatial-spectral excitation. Spatial-spectral excitation generally requires high gradient performance when applied to high field 2-D imaging, and MR scanners equipped with conventional gradient systems may need Bo eddy current compensation. Although the scanner used in the studies related to this invention does not require eddy current compensation, image slice thickness is still limited by its performance. At 1.5 T, the time between successive sub-pulses in the spatial-spectral excitation is 2.3 ms. Since the scanner has a maximum gradient strength of 23 mT/m and a maximum gradient switched rate of 120 mT/m/ms, the minimum gradient ramp time from zero to maximum is about 0.2 ms. With this ramp time, the constant portion of each positive gradient lobe, in which the RF sub-pulse can be applied, is 0.8 ms long. For this pulse width, the corresponding bandwidth of the SLR sub-pulse is 4.5 kHz. Using the maximum gradient amplitude of the scanner, the minimum slice thickness is 5 mm. Since the SLR sub-pulse consists of only one wave-cycle, the sub-pulse design cannot be further modified to significantly decrease the RF bandwidth for thinner slices without resulting in an unacceptable deterioration in the slice profile. An obvious way to reduce the slice thickness will be to use gradient systems with higher gradient strength and faster switched rate. Alternatively, thinner slices can be obtained on lower static field systems where the separation between RF sub-pulses is wider, leaving longer time duration for each sub-pulse. A possible way to reduce slice thickness without resorting to different hardware is to use the so-called "type II" spatial-spectral pulse. However, that technique is highly susceptible to gradient imperfection and Bo field inhomogeneity and will require additional phase shift correction for many clinical applications.

In the current implementation of IWFSEC, longer minimum TE values are required. The minimum TE values for the first and second water echoes are 22 ms and 86 ms respectively, while that of the fat echo is 17 ms. These values are, however, close to the corresponding values of 20 ms and 80 ms used in many of the musculoskeletal imaging protocols at our institution, and should not significantly affect the clinical results. To decrease the TE values, a shorter 1-2-1 binomial spatial-spectral pulse can be used in place of the 1-3-3-1 pulse for the first 180° pulse, with an increase in Bo inhomogeneity sensitivity. Another way to reduce TE is to use a non-spectral selective pulse for the first 180° pulse. Using the 3.2 ms long 180° pulse of the regular SE sequence, the TE values of the first and second water echoes can be reduced by 5 ms and 10 ms respectively. This approach also allows the prescription of contiguous slices that the spatial-spectral 180° pulse prohibits due to its larger slice thickness compared to the excitation slice. However, using a non-spectral selective first 180° pulse alters the fat signal, since the fat experiences partial inversion recovery. Nevertheless, this approach can be used when shorter TE values or contiguous slices are needed and changes in water/fat contrast in the water-plus-fat image do not significantly affect diagnostic evaluation.

Since IWFSEC simultaneously provides PDW water-plus-fat, PDW water-only, and T2W water-only images, it gives both detailed anatomic information and accurate information of pathology during a single data acquisition time. This technique also eliminates chemical-shift artifacts from water-plus-fat images in both in-plane and through-plane directions. For these reasons, it has great potential in clinical musculoskeletal imaging.

While a preferred embodiment has been set forth above, those skilled in the art who have reviewed the present disclosure will readily appreciate that other embodiments can be realized within the scope of the present invention. For example, the use of specific equipment is illustrative rather than limiting, as is the recitation of certain numerical values. Although the present invention is implemented on a dual-echo spin echo sequence, it can also be implemented on a single-echo spin echo sequence or any multi-echo spin echo sequences. Also, while the subject has been disclosed as a human body part, the present invention can be used for any other suitable subject, such as an animal body part. Therefore, the present invention should be construed as limited only by the appended claims.

We claim:

1. A method for magnetic resonance imaging of a subject which comprises water and fat, the method comprising:
   (a) taking a first, water-only selective echo spin echo (proton-density-weighted) image of the water;
   (b) taking a first, fat-only selective echo spin echo (proton-density-weighted) image of the fat;
   (c) taking a second, water-only selective echo spin echo (T2-weighted image) of the water; and
   (d) imaging the subject in accordance with the images taken in steps (a)–(c) to achieve an image of the subject with intrinsic chemical shift elimination in a single acquisition time.

2. The method of claim 1, wherein:
   step (a) is performed using an excitation frequency set at the resonance frequency of the water; and
   step (b) is performed using an excitation frequency set at the resonance frequency of the fat.

3. The method of claim 1, wherein:
   step (a) is performed using a receiver frequency set at the resonance frequency of water; and
   step (b) is performed using a receiver frequency set at the resonance frequency of fat.

4. The method of claim 1, further comprising applying a spoiling gradient to the subject to spoil a first water echo corresponding to the proton-density-weighted image of the water.

5. The method of claim 4, further comprising applying a refocusing gradient to the subject to refocus a second water echo corresponding to the T2-weighted image of the water.

6. The method of claim 1, wherein:
   step (a) comprises applying a binomial 1-3-3-1 90° and 180° excitation to the subject at a resonance frequency of the water and applying a first readout gradient to the subject;
   step (b) comprises applying a binomial 1-3-3-1 90° excitation to the subject at a resonance frequency of the fat, a non-spectrally selective 180° excitation and applying a second readout gradient to the subject; and
   step (c) comprises applying a non-spectrally selective 180° excitation, a refocusing gradient and a third readout gradient to the subject.

7. The method of claim 1, wherein steps (a)–(c) are performed a plurality of times for a plurality of phase encoding steps.

8. The method of claim 1, wherein step (d) comprises:
   performing a Fourier transform on the images taken in steps (a) and (c) to form a water image; and
   performing a Fourier transform on the images taken in step (b) to form a fat image.

9. The method of claim 8, wherein step (d) further comprises combining the proton-density-weighted water image with the proton-density-weighted fat image to form a water-plus-fat image.

10. The method of claim 1, wherein the subject is a body part.

11. The method of claim 10, wherein the body part is a human body part.

12. The method of claim 10, wherein the body part is an animal body part.

13. A system for magnetic resonance imaging of a subject which comprises water and fat, the system comprising:
   gradient and RP coils for applying an imaging sequence to the subject;
   a controller for controlling the coils to apply the imaging sequence to the object such that the imaging sequence comprises pulses and gradients for:
      (a) taking a first, water-only selective echo spin echo (proton-density-weighted) image of the water;
      (b) taking a first, fat-only selective echo spin echo (proton-density-weighted) image of the fat; and
      (c) taking a second, water-only selective echo spin echo (T2-weighted) image of the water; and
   an imaging device which receives the proton-density-weighted images and the T2-weighted image and for imaging the subject and which achieves an image of the subject with intrinsic chemical shift elimination in a single acquisition time.

14. The system of claim 13, wherein the controller controls the gradient and RF coils such that:
   the excitation pulses for taking the proton-density-weighted image of the water are at a frequency set at a resonance frequency of the water; and
   the excitation pulses for taking the proton-density-weighted image of the fat are at a frequency set at a resonance frequency of the fat.

15. The system of claim 13, wherein the gradient and RF coils have a receiver channel, and wherein the controller controls the gradient and RF coils such that:
   in taking the proton-density-weighted image of the water, a frequency of the receiver channel is set at a resonance frequency of the water; and
   in taking the proton-density-weighted image of the fat, the frequency of the receiver channel for is set at a resonance frequency of the fat.

16. The system of claim 13, wherein the controller further controls the gradient coils to apply a spoiling gradient to the subject to spoil a first water echo corresponding to the proton-density-weighted image of the water.

17. The system of claim 16, wherein the controller further controls the gradient coils to apply a refocusing gradient to the subject to refocus a second water echo corresponding to the T2-weighted image of the water.

18. The system of claim 13, wherein:
   the pulses and gradients for taking the proton-density-weighted image of the water comprises a binomial 1-3-3-1 90° and 180° excitation to the subject at a resonance frequency of the water and a first readout gradient;

the pulses and gradients for taking the proton-density-weighted image of the fat comprise a binomial 1-3-3-1 90° excitation to the subject at a resonance frequency of the fat, a non-spectrally selective 180° excitation and a second readout gradient; and the gradients for taking the T2-weighted image of the water comprise a refocusing gradient, a non-spectrally selective 180° excitation and a third readout gradient to the subject.

19. The system of claim 13, wherein the controller controls the gradient and RF coils to take the proton-density-weighted images and the T2-weighted image a plurality of times for a plurality of phase encoding steps.

20. The system of claim 13, wherein the imaging device images the subject by:

performing a Fourier transform on the proton-density-weighted and T2-weighted images of the water to form a water image; and performing a Fourier transform on the proton-density-weighted image of the fat to form a fat image.

21. The system of claim 13, wherein the imaging device further combines the proton-density-weighted water image with the proton-density-weighted fat image to form a water-plus-fat image.

* * * * *